United States Patent
Sato et al.

(10) Patent No.: US 10,927,445 B2
(45) Date of Patent: Feb. 23, 2021

(54) SURFACE-COATED CUTTING TOOL PROVIDING EXCELLENT CHIPPING RESISTANCE AND WEAR RESISTANCE IN HEAVY INTERMITTENT CUTTING

(71) Applicant: MITSUBISHI MATERIALS CORPORATION, Tokyo (JP)

(72) Inventors: Shun Sato, Naka (JP); Masakuni Takahashi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 184 days.

(21) Appl. No.: 15/755,982

(22) PCT Filed: Aug. 25, 2016

(86) PCT No.: PCT/JP2016/074805
§ 371 (c)(1),
(2) Date: Feb. 27, 2018

(87) PCT Pub. No.: WO2017/038618
PCT Pub. Date: Mar. 9, 2017

(65) Prior Publication Data
US 2019/0040519 A1    Feb. 7, 2019

(30) Foreign Application Priority Data

Aug. 29, 2015 (JP) ............................ JP2015-169878
Aug. 18, 2016 (JP) ............................ JP2016-160901

(51) Int. Cl.
*C23C 14/06* (2006.01)
*C23C 28/04* (2006.01)
(Continued)

(52) U.S. Cl.
CPC .......... *C23C 14/0617* (2013.01); *B32B 18/00* (2013.01); *C23C 14/0641* (2013.01);
(Continued)

(58) Field of Classification Search
CPC ............ C23C 14/0617; C23C 14/0641; C23C 28/044; C23C 28/42
See application file for complete search history.

(56) References Cited

U.S. PATENT DOCUMENTS

2005/0238890 A1* 10/2005 Kubota ................ B82Y 30/00
428/446
2007/0269610 A1    11/2007 Fukui et al.
(Continued)

FOREIGN PATENT DOCUMENTS

JP    2006-082209 A    3/2006
JP    2008-188734 A    8/2008
(Continued)

OTHER PUBLICATIONS

Supplemental European Search Report dated Feb. 22, 2019 in corresponding European Application No. 16841650.1.
(Continued)

*Primary Examiner* — Laura A Auer
(74) *Attorney, Agent, or Firm* — Leason Ellis LLP

(57) ABSTRACT

Provided is a surface-coated cutting tool including: a tool body (3) and a hard coating layer on the tool body (3). The hard coating layer has an alternate laminate structure of A (1) and B layers (2). The A layer (1) is a Ti and Al complex nitride layer satisfying a compositional formula: $(Ti_{1-z}Al_z)N$, $0.4 \leq z \leq 0.7$. The B layer (2) is a Cr, Al and M complex nitride layer satisfying a compositional formula: $(Cr_{1-x-y}Al_xM_y)N$, $0.03 \leq x \leq 0.4$ and $0 \leq y \leq 0.05$. The value of a ratio tB/tA of the average layer thickness of the B layer (2) to the average layer thickness of the A layer (1) satisfies 0.67 to 2.0. The lattice constant a(Å) of crystal grains of the hard coating layer satisfies $4.10 \leq a \leq 4.20$. The ratio of I(200) to I(111) satisfies $2.0 \leq I(200)/I(111) \leq 10$.

4 Claims, 4 Drawing Sheets

(51) Int. Cl.
    *C23C 28/00*     (2006.01)
    *C23C 14/32*     (2006.01)
    *B32B 18/00*     (2006.01)
    *C23C 14/48*     (2006.01)

(52) U.S. Cl.
    CPC ............ *C23C 14/325* (2013.01); *C23C 14/48* (2013.01); *C23C 28/042* (2013.01); *C23C 28/044* (2013.01); *C23C 28/42* (2013.01); *B32B 2250/42* (2013.01); *Y10T 428/2495* (2015.01); *Y10T 428/24975* (2015.01)

(56) References Cited

U.S. PATENT DOCUMENTS

| | | | |
|---|---|---|---|
| 2015/0050489 A1* | 2/2015 | Kumar | C23C 14/0641 428/336 |
| 2015/0125678 A1* | 5/2015 | Park | B32B 15/01 428/216 |

FOREIGN PATENT DOCUMENTS

| | | |
|---|---|---|
| JP | 2009-101491 A | 5/2009 |
| JP | 2010-012564 A | 1/2010 |
| JP | 2010-284787 A | 12/2010 |
| JP | 2011-194535 A | 10/2011 |
| JP | 2011-218513 A | 11/2011 |
| JP | 2012-097303 A | 5/2012 |
| JP | 2014-091169 A | 5/2014 |
| WO | WO-2006/070509 A | 7/2006 |
| WO | WO-2013165092 A1 * | 11/2013 ............. B23B 15/01 |

OTHER PUBLICATIONS

Ding et al: "Cr"1"—"xAl"xN coatings deposited by lateral rotating cathode arc for high speed machining applications", Thin Solid Films, Elsevier, Amsterdam, NL, vol. 516, No. 8, Feb. 1, 2008 (Feb. 1, 2008), pp. 1710-1715.

Ping Li et al., "Microstructure, mechanical and thermal properties of TiAlN/CrAlN multilayer coatings", *Int. Journal of Refractory Metals and Hard Materials*, 2013, pp. 51-57, vol. 40.

International Search Report dated Nov. 15, 2016 for the corresponding PCT Application No. PCT/JP2016/074805.

* cited by examiner

| VALUES OBTAINED FROM X-RAY DIFFRACTION RESULTS | |
|---|---|
| I(200)/I(111) | 5.53 |
| LATTICE CONSTANT a (Å) CALCULATED FROM (200) PEAK | 4.17 |

SURFACE-COATED CUTTING TOOL PROVIDING EXCELLENT CHIPPING RESISTANCE AND WEAR RESISTANCE IN HEAVY INTERMITTENT CUTTING

CROSS-REFERENCE TO RELATED PATENT APPLICATIONS

This application is a U.S. National Phase Application under 35 U.S.C. § 371 of International Patent Application No. PCT/JP2016/074805 filed on Aug. 25, 2016 and claims the benefit of Japanese Patent Application No. 2015-169878, filed Aug. 29, 2015, and Japanese Patent Application No. 2016-160901, filed Aug. 18, 2016, all of which are incorporated herein by reference in their entireties. The International Application was published in Japanese on Mar. 9, 2017 as International Publication No. WO/2017/038618 under PCT Article 21(2).

FIELD OF THE INVENTION

The present invention relates to a surface-coated cutting tool (hereinafter, referred to as a coated tool) showing excellent chipping resistance and wear resistance of a hard coating layer and providing excellent cutting performance for long term use in heavy intermittent cutting of an alloy steel or the like in which an intermittent and impacting heavy load is exerted to a cutting edge.

BACKGROUND OF THE INVENTION

In general, a surface-coated cutting tool is a throwaway tip detachably attached to a tip portion of a holder and used in turning or planning of a workpiece such as various types of steel, cast iron, or the like, a drill or a miniature drill used in drilling or the like of the workpiece, a solid type end mill used in face milling, slotting, shoulder milling, or the like of the workpiece, or the like, and in addition, a throwaway end mill tool or the like, to which the throwaway tip is detachably attached, and is configured to perform cutting like the solid type end mill, which are known.

In addition, a coated tool formed by coating a hard coating layer constituted by a complex nitride ((Cr, Al)N) layer of Cr and Al or a complex nitride ((Ti, Al)N) layer of Ti and Al on a surface of a body (hereinafter, these are generally referred to as a tool body) constituted by a tungsten carbide (hereinafter, represented by WC)-based cemented carbide, a titanium carbonitride (hereinafter, represented by TiCN)-based cermet or a cubic boron nitride sintered material (hereinafter, represented by cBN) through an arc ion plating method is used as the coated tool.

Then, in order to improve cutting performance of the coated tool, many proposals are provided.

For example, Patent Literature 1 proposes that fracture resistance of a hard coating layer in heavy cutting is improved by configuring the hard coating layer using a (Cr, Al)N layer formed of a complex nitride layer of Cr and Al satisfying a compositional formula $(Cr_{1-X}Al_X)N$ (however, in the atomic ratio, X is 0.40 to 0.70) on a tool body surface and showing a biaxial crystal orientation in which an area ratio of crystal grains having a crystal orientation <100> within a range of 0 to 15 degrees from a normal direction of a polishing surface as a surface of the complex nitride layer is 50% or more and further an area ratio of crystal grains having a crystal orientation <100> within a range of 15 degrees of centering on a maximum peak present within a range of 0 to 54 degrees with respect to an arbitrary orientation perpendicular to a normal line of the polishing surface as a surface of the complex nitride layer is 50% or more when crystal orientation analysis by electron beam backward scattering diffraction (EBSD) is performed on the complex nitride layer.

In addition, Patent Literature 2 proposes that a life time of a coated tool can be increased by achieving a reduction in residual compressive stress while maintaining a high hardness and increasing an adhesion strength of hard film layers 1 and 2 provided that the hard film layer 1 is coated on a side of a surface and the hard film layer 2 is coated on a side of a tool body, the hard film layer 1 is $(Cr_{1-a}Al_a)N_x$, here, $0.5 \le a \le 0.75$ and $0.9 \le x \le 1.1$, the hard film layer 2 is $(Ti_b Al_{1-b})N_y$, here, $0.4 \le b \le 0.6$ and $0.9 \le y \le 1.1$, when a lattice constant of a (200) plane of the hard film layer 1 in X-ray diffraction is $\alpha_1$ (nm), $0.411 \le \alpha_1 \le 0.415$ is satisfied, and when a lattice constant of a (200) plane of the hard film layer 2 is $\alpha_2$ (nm), $0.413 \le \alpha_2 \le 0.418$ is satisfied.

In addition, Patent Literature 3 proposes that a life time of a coated tool can be increased by achieving a reduction in residual compressive stress while maintaining a high hardness and increasing an adhesion strength of hard film layers 1 and 2 provided that the hard film layer 1 is coated on a side of a surface and the hard film layer 2 is coated on a side of a tool body, the hard film layer 1 is $(Cr_{1-a}Al_a)N_x$, here, $0.5 \le a \le 0.75$ and $0.9 \le x \le 1.1$, the hard film layer 2 is $(Ti_b Al_{1-b})N_y$, here, $0.4 \le b \le 0.6$ and $0.9 \le y \le 1.1$, and when a lattice constant of a (111) plane of the hard film layer 1 in X-ray diffraction is $a_2$ (nm) and a lattice constant of a (111) plane of the hard film layer 2 is $a_2$ (nm), $1.005 \le a_2 a_1 \le 1.025$ is satisfied.

In addition, Patent Literature 4 proposes that, in a coated tool formed by coating a $(Cr_{1-X}Al_X)N$ layer $(0.1 \le x \le 0.6)$ on a tool body surface, fracture resistance and a toughness in intermittent heavy cutting is improved provided that an area occupied by crystal grains having a particle diameter of 10 to 100 nm is 90% or more in the measured area when $(Cr_{1-X}Al_X)N$ crystal grains have columnar crystal structures having heights equal to an average layer thickness and a crystal grain structure in a horizontal cross section of the $(Cr_{1-X}Al_X)N$ layer is observed and an area occupied by a division of a diameter of 0.2 to 4 μm surrounded by a crystal interface having a crystal misorientation between neighboring measurement points of 15 degrees or more is 20% or more in an entire measured area when a crystal orientation of crystal grains of a surface is measured by an electron beam backward scattering diffraction device.

In addition, Patent Literature 5 proposes that, in a coated tool formed by coating a hard film on a tool body surface, wear resistance and oxidation resistance of the hard film are improved as the hard film is constituted by at least one element selected from an M component of Cr and Al, carbon, nitrogen, oxygen, and boron (provided that the M component is at least one element selected from 4a, 5a, and 6a family elements of the periodic table and Si, and Zr).

Further, Patent Literature 6 proposes that lubricity and wear resistance in high-speed intermittent cutting are improved as a lower layer formed of a (Ti, Al)-based complex nitride or a complex carbonitride layer and an upper layer formed of a (Cr, Al)-based complex nitride layer are coated on a surface of a tool body, and the upper layer is configured as an alternating laminated structure of a thin layer A formed in a cubic crystal structure and a thin layer B formed in combination of a cubic crystal structure and a hexagonal crystal structure.

Further, the lower layer is a complex nitride or a complex carbonitride layer of Ti, Al, and $M_1$ that satisfy $0.4 \le Q \le 0.65$ and $0 \leq R \leq 0.1$ when expressed by the compositional formula: $(Ti_{1-Q-R}Al_QM_{1R})(C, N)$ (here, Q is a content ratio of Al in an atomic ratio, R is a total content ratio of an component $M_1$ with respect to the atomic ratio, and the component $M_1$ shows one or two elements or more selected from Si, B, Zr, Y, V, W, Nb and Mo), the thin layer A is a complex nitride layer formed in a cubic crystal structure or Cr, Al, and $M_2$ that satisfy a $0.25 \leq \alpha \leq 0.65$ and $0 < \beta \leq 0.1$ when expressed by the compositional formula: $(Cr_{1-\alpha-\beta}Al_\alpha M_{2\beta})N$ (here, $\alpha$ is a content ratio of Al in an atomic ratio, $\beta$ is a total content ratio of an component $M_2$ with respect to the atomic ratio, and the component $M_2$ shows one or two elements or more selected from Zr, Y, V, W, Nb, Mo and Ti), and further, the thin layer B is a complex nitride layer of Cr, Al, and $M_3$ that satisfy $0.75 \leq \gamma \leq 0.95$ and $0 < \delta \leq 0.1$ when expressed by the compositional formula: $(Cr_{1-\gamma-\delta}Al_\gamma M_{3\delta})N$ (here, $\gamma$ is a content ratio of Al in an atomic ratio, $\delta$ is a total content ratio of a component $M_3$ with respect to the atomic ratio, and the component $M_3$ shows one or two elements or more selected from Zr, Y, V, W, Nb, Mo and Ti).

CITATION LIST

Patent Literature

[Patent Literature 1]
Japanese Unexamined Patent Application, First Publication No. 2008-188734
[Patent Literature 2]
Japanese Unexamined Patent Application, First Publication No. 2010-12564
[Patent Literature 3]
Japanese Unexamined Patent Application, First Publication No. 2010-284787
[Patent Literature 4]
Japanese Unexamined Patent Application, First Publication No. 2011-194535
[Patent Literature 5]
Japanese Unexamined Patent Application, First Publication No. 2006-82209
[Patent Literature 6]
Japanese Unexamined Patent Application, First Publication No. 2009-101491

SUMMARY OF INVENTION

Technical Problem

In recent years, high performance of a cutting apparatus has been remarkable, and on the other hand, there is a strong demand for labor saving and energy saving for cutting, and according to thereto, cutting tends to be highly efficient.

In the conventional coated tools proposed in Patent Literatures 1 to 6, while there is no particular problem when the coated tools are used in cutting under a conventional condition of steel or cast iron, specifically, when the coated tools are used under a heavy intermittent cutting condition of an alloy steel in which an intermittent and impacting heavy load is exerted to a cutting edge, since chipping or the like may easily occur and wear resistance cannot also be satisfied, a lift time may be terminated after a relatively short time.

Solution to Problem

Accordingly, from the above-mentioned viewpoint, the inventor(s) et al have earnestly studied and developed a coated tool having excellent wear resistance while providing an excellent chipping resistance of a hard coating layer in heavy intermittent cutting of alloy steel or the like in which an intermittent and impacting heavy load is exerted particularly to a cutting edge, and obtained the following knowledge.

(a) First, in a conventional coated tool in which a hard coating layer is constituted by a (Cr, Al)N layer or a (Cr, Al, M)N layer, Al, which is a constituent of the hard coating layer, improves a high temperature hardness and thermal resistance, Cr improves high temperature strength, high temperature oxidation resistance is improved in a state in which Cr and Al are commonly contained, and properties of the hard coating layer are improved according to types of an M component such that Zr, which is an added constituent M, improves thermal plastic deformation resistance, V improves lubricity, Nb improves high temperature wear resistance, Mo improves welding resistance, W improves heat dissipation, and Ti further improves high temperature hardness, and as the hard coating layer contains these M components, fracture resistance, welding resistance, oxidation resistance and wear resistance are improved, which are already known by Patent Literatures 1 to 6.

(b) In addition, since the (Ti, Al)N layer has excellent high temperature strength and further has excellent adhesion strength with respect to a tool body and the (Cr, Al, M)N layer, when the hard coating layer is formed as a laminated structure of an A layer and a B layer using the (Ti, Al)N layer as the A layer and the (Cr, Al, M)N layer as the B layer, the entire hard coating layer forms a coated tool having excellent high temperature strength and excellent chipping resistance, which are also already known by Patent Literatures 2, 3 and 6.

(c) However, the inventor(s) has found that, in particular, as a lattice constant of crystal grains that constitute the entire hard coating layer made of the A layer and the B layer and an XRD peak intensity ratio of a (111) plane and a (200) plane of the crystal grains that constitute the hard coating layer are restricted within a predetermined range, a balance of hardness and plastic deformation provided in the B layer can be achieved, and thus, an intermittent and impacting heavy load exerted to a cutting edge during cutting can be attenuated and chipping resistance of the hard coating layer can be improved.

In addition, as a result of performing a nanoindentation test on the B layer of the present invention, it was confirmed that a value of a plastic deformation work ratio $W_{plast}/(W_{plast}+W_{elast})$ was within a range of 0.35 to 0.50.

(d) Further, the inventor(s) has found that as the B layer is configured as the alternating laminated structure with the A layer, further excellent chipping resistance and wear resistance are exhibited over long term use while adhesion strength between the tool body and the hard coating layer and adhesion strength between alternately laminated layers are secured.

SUMMARY OF THE INVENTION

The present invention was made on the basis of the above-mentioned research results and directed to aspects indicated below.

(1) A surface-coated cutting tool comprising: a tool body made of a tungsten carbide-based cemented carbide, a titanium carbonitride-based cermet or a cubic boron nitride sintered material; and a hard coating layer provided on a surface of the tool body, the hard coating layer being made of an alternate laminate structure, in which at least each of an A layer and a B layer is laminated alternately, and having a total thickness of 0.5-3.0 μm, wherein (a) the A layer is a complex nitride layer of Ti and Al satisfying a compositional formula: $(Ti_{1-z}Al_z)N$, $0.4 \le z \le 0.7$, z being a content ratio of Al in an atomic ratio, (b) the B layer is a complex nitride layer of Cr, Al, and M satisfying a compositional formula: $(Cr_{1-x-y}Al_xM_y)N$, $0.03 \le x \le 0.4$ and $0 \le y \le 0.05$, x being a content ratio of Al in an atomic ratio, y being a total content ratio of an component M in an atomic ratio, and component M being one or more elements selected from: B, Si, and 4a, 5a, and 6a family elements of the periodic table except for Cr, (c) when an average layer thickness of one layer of the A layer is tA and an average layer thickness of one layer of the B layer is tB, a value of a ratio tB/tA of the average layer thickness of the one layer of the B layer with respect to the average layer thickness of the one layer of the A layer satisfies 0.67 to 2.0, (d) a lattice constant a(Å) of crystal grains that constitute a hard coating layer made of the A layer and the B layer calculated from a diffraction peak angle of a (200) plane obtained by X-ray diffraction of the entire hard coating layer made of the A layer and the B layer satisfies $4.10 \le a \le 4.20$, and (e) when an X-ray diffraction peak intensity of the (200) plane is I(200) and an X-ray diffraction peak intensity of a (111) plane is I(111), each of I(200) and I(111) being obtained by the X-ray diffraction of the entire hard coating layer made of the A layer and the B layer, $2.0 \le I(200)/I(111) \le 10$ is satisfied.

(2) The surface-coated cutting tool according to (1) is characterized in that a value of a plastic deformation work ratio $W_{plast}/(W_{plast}+W_{elast})$, which is obtained by performing a nanoindentation test at an indentation depth of 1/10 or less of a layer thickness of the B layer, is within a range of 0.35 to 0.50.

Next, the coated tool of the present invention will be described in more detail.

A Layer:

While FIG. 1 shows a longitudinal cross-sectional schematic diagram of a hard coating layer of a coated tool of the present invention, since a complex nitride layer of Ti and Al that constitute an A layer (1) of the hard coating layer formed in an alternating laminated structure (hereinafter, simply referred to as "a (Ti, Al)N layer") has excellent high temperature strength and further has excellent adhesion strength with respect to both of a tool body (3) and a B layer (2), which constitutes alternating lamination, interlayer adhesion strength between the A layer and the B layer can be increased by forming the hard coating layer formed in the alternating laminated structure of the A layer (1) and the B layer (2), and as a result, chipping resistance can be improved without decreasing wear resistance.

However, when (Ti, Al)N is expressed by a compositional formula: $(Ti_{1-z}Al_z)N$, wear resistance is deteriorated because a high temperature hardness is decreased when a z value (an atomic ratio) showing a content ratio of Al is less than 0.4, sufficient high temperature strength cannot be secured according to a relative reduction of a Ti content ratio and a hardness is decreased as crystal grains having a hexagonal crystal structure appear, and as a result, the wear resistance is decreased when the z value (the atomic ratio) exceeds 0.7. Therefore, the z value (the atomic ratio) showing the content ratio of Al in the A layer (1) is determined as $0.4 \le z \le 0.7$.

B Layer:

A complex nitride layer of Cr, Al, and M (hereinafter, referred to as "a (Cr, Al, M)N layer") that constitute the B layer (2) improves high temperature strength and improves chipping resistance of the hard coating layer according to Cr, which is a main component of the B layer (2), and contributes to improvement by of high temperature oxidation resistance by coexistent containment of Al component, and further functions as a layer of attenuating an intermittent and impacting heavy load exerted to the hard coating layer during heavy intermittent cutting.

However, when a composition of a (Cr, Al, M)N layer is expressed by a compositional formula: $(Cr_{1-x-y}Al_xM_y)N$, hardness is enhanced but lattice strain is increased when an x value (an atomic ratio) showing a content ratio of Al exceeds 0.4, chipping resistance is decreased, on the other hand, the wear resistance is decreased when the x value (the atomic ratio) is less than 0.03. Therefore, the x value (the atomic ratio) is 0.03 or more and 0.4 or less.

Meanwhile, while the M component shows one or two elements or more selected from B, Si, and 4a, 5a and 6a family elements of the periodic table except for Cr, when a y value (an atomic ratio) showing a total content ratio of the M component exceeds 0.05, the lattice strain is increased and the chipping resistance is decreased. Therefore, the y value (the atomic ratio) is $0 \le y \le 0.05$.

Zr, Ti, V, Nb, Mo, W, B, Si, and the like, are exemplified as a specific example of the M component.

In the components M, while Zr improves thermal plastic deformation resistance, Ti improves high temperature hardness, V improves lubricity, Nb improves high temperature wear resistance, Mo improves welding resistance, W improves heat dissipation, B improves lubricity while increasing film hardness, and Si improves thermal resistance, as described above, since the chipping resistance of the B layer (2) is decreased according to an increase in lattice strain when the y value (the atomic ratio) showing the total content ratio of the M component exceeds 0.05, an upper limit of the total content ratio of the M component is 0.05.

Alternating Lamination of A Layer and B Layer:

While a hard coating layer having a total layer thickness of 0.5 to 3.0 μm and formed in an alternating laminated structure is configured by alternately laminating the A layer (1) and the B layer (2) at least one by one, when the average layer thickness of one layer of the A layer (1) is tA and the average layer thickness of one layer of the B layer (2) is tB, a value of a ratio tB/tA of the average layer thickness of the one layer of the B layer (2) with respect to the average layer thickness of the one layer of the A layer (1) should be 0.67 to 2.0.

The reason for this is that, while sufficient chipping resistance cannot be obtained because a ratio of the B layer (2), which occupies the hard coating layer, is small when a layer thickness ratio tB/tA is less than 0.67, on the other hand wear resistance is decreased when the layer thickness ratio tB/tA exceeds 2.0.

In addition, while sufficient wear resistance cannot be provided for a long time when the total layer thickness of the hard coating layer formed in the alternating laminated structure is less than 0.5 μm, the hard coating layer is prone to self-destruction when the total layer thickness exceeds 3.0 μm. Therefore, a total layer thickness of the hard coating layer is 0.5 to 3.0 μm.

Further, since adhesion strength of the tool body (3) and the hard coating layer can be secured by forming the A layer (1) directly on the surface of the tool body (3), an intermittent and shocking high load exerted during a heavy intermittent cutting can be effectively attenuated by forming the B layer (2) on the outermost surface of the hard coating layer, and further, chipping resistance can be improved, in configuring the alternating lamination formed of the A layer (1) and the B layer (2), the A layer (1) is preferably formed directly on the surface of the tool body (3) and the B layer (2) is preferably formed on the outermost surface of the hard coating layer in configuring the alternating lamination.

Further, a composition of the A layer (1) and the B layer (2), the average layer thickness of the one layer and a total layer thickness of the hard coating layer can be measured by cross section measurement of a longitudinal cross section of the hard coating layer perpendicular to the surface of the tool body (3) using scanning electron microscopy (SEM), a transmission electron microscope (TEM), energy dispersive X-ray spectroscopy (EDS).

Orientation and Lattice Constant of Crystal Grains of Entire Hard Coating Layer Formed of A Layer and B Layer:

In the present invention, a lattice constant a and an orientation of the crystal grains of the entire hard coating layer formed of the A layer (1) and the B layer (2) can be controlled according to a deposition condition when the A layer (1) and the B layer (2) are deposited.

That is, while the hard coating layer is deposited using, for example, an arc ion plating apparatus (4) shown in FIGS. 2A and 2B in the present invention, the lattice constant of the crystal grains can be controlled according to a composition and a bias voltage of a target when the A layer (1) and the B layer (2) are deposited, and the orientation can be controlled by controlling an arc current value, a partial pressure of nitrogen gas serving as a reactant gas, a bias voltage, and a depositing temperature and adjusting a speed of a crystal growth and a diffusion speed of an atom. As a crystal relatively slowly grows, a (200) plane having surface energy smaller than that of a (111) plane of the crystal grains can be primarily oriented parallel to the surface of the tool body (3).

Then, provided that X-ray diffraction is performed with respect to the crystal grains that constitute the entire hard coating layer formed of the A layer (1) and the B layer (2), a diffraction peak intensity of the (200) plane is I(200) and a diffraction peak intensity of the (111) plane is I(111) while chipping resistance is decreased because the orientation of the (111) plane, which is a close-packed plane, is strong when a value of I(200)/I(111) is less than 2, and wear resistance is decreased because a (200) orientation is extremely strong when the value of I(200)/I(111) exceeds 10.

Accordingly, in order to combine excellent chipping resistance and wear resistance, the value of I(200)/I(111) of the crystal grains that constitute the entire hard coating layer formed of the A layer (1) and the B layer (2) should be 2 or more and 10 or less.

In addition, while a lattice constant a(Å) can be calculated from an X-ray diffraction peak angle of the (200) plane of the crystal grains of the entire hard coating layer formed of the A layer (1) and the B layer (2), since the lattice strain becomes too large and the hard coating layer is likely to be broken down during cutting when the calculated lattice constant a(Å) is less than 4.10 or more than 4.20, the lattice constant a(Å) of the crystal grains of the entire hard coating layer formed of the A layer (1) and the B layer (2) is 4.10 or more and 4.20 or less.

While FIG. 3 shows an example of an X-ray diffraction chart obtained by measuring the coated tool of the present invention, it should be appreciated from the chart that the value of I(200)/I(111) of the crystal grains of the entire hard coating layer formed of the A layer (1) and the B layer (2) is 2 or more and 10 or less and the lattice constant a(Å) is 4.10 or more and 4.20 or less.

Plastic deformation work ratio $W_{plast}/(W_{plast}+W_{elast})$ of B layer: It was confirmed that a nanoindentation test was performed at an indentation depth of 1/10 or less of a layer thickness of the B layer (2) in order to recognize a attenuating effect of an intermittent and impacting heavy load during cutting exhibited by the B layer (2) of the hard coating layer of the present invention, and the value was within a range of 0.35 to 0.50 in obtaining the plastic deformation work ratio $W_{plast}/(W_{plast}+W_{elast})$.

Here, the plastic deformation work ratio $W_{plast}/(W_{plast}+W_{elast})$ is shown in schematic explanation views of FIGS. 4 and 5, a load is exerted to an indentation depth of 1/10 or less of a layer thickness of the B layer (2) and the surface of the B layer (2) is displaced (see FIG. 4), a load curve of a displacement-load is obtained (see FIG. 5) and then the load is removed to obtain an unloading curve of the displacement-load (see FIG. 5), a plastic deformation work ratio $W_{plast}$ and an elastic deformation work $W_{elast}$ are obtained from a difference of the load curve and the unloading curve, and the plastic deformation work ratio $W_{plast}/(W_{plast}+W_{elast})$ can be calculated from these values.

Then, when the plastic deformation work ratio $W_{plast}/(W_{plast}+W_{elast})$ is within a range of 0.35 or more and 0.50 or less, since the B layer (2) has a shock attenuating property without decreasing plastic deformation resistance, excellent chipping resistance is provided even if the (Cr, Al, M)N layer is prepared under a heavy intermittent cutting condition.

A shock attenuating property is insufficient when the plastic deformation work ratio $W_{plast}/(W_{plast}+W_{elast})$ is less than 0.35, sufficient chipping resistance is not obtained when the (Cr, Al, M)N layer is prepared under the heavy intermittent cutting condition, plastic deformation resistance is decreased and sufficient wear resistance cannot be obtained when the plastic deformation work ratio $W_{plast}/(W_{plast}+W_{elast})$ exceeds 0.50. Therefore, the plastic deformation work ratio $W_{plast}/(W_{plast}+W_{elast})$ is 0.35 or more and 0.50 or less.

Here, the fact that the indentation depth is 1/10 or less of the layer thickness of the B layer (2) means that an influence on a lower layer is excluded. While a lower limit is not particularly determined, for example, it is possible to recognize a tool as the coated tool of the present invention by recognizing that the indentation depth is varied 0.1, 0.09, or 0.08 times the layer thickness of the B layer (2) and the plastic deformation work ratio $W_{plast}/(W_{plast}+W_{elast})$ is within a range of 0.35 or more and 0.50 or less.

Advantageous Effects of Invention

In a coated tool of the present invention, since a hard coating layer is formed in an alternating laminated structure obtained by alternately laminating an A layer formed of $(Ti_{1-z}Al_z)N$ and a B layer formed of $(Cr_{1-x-y}Al_xM_y)N$ at least one by one, the entire hard coating layer has excellent adhesion strength and wear resistance, a lattice constant a(Å) of crystal grains that constitute the entire hard coating layer made of the A layer and the B layer satisfies 4.10≤a≤4.20, a value of diffraction peak intensity ratio I(200)/I(111) of a (200) plane and a (111) plane satisfies 2.0≤I(200)/I(111)≤10, and further, a plastic deformation work ratio $W_{plast}/(W_{plast}+W_{elast})$ of the B layer of an outermost surface of the hard coating layer is within a range of 0.35 or more and 0.50 or less, excellent wear resistance is provided for a long time without occurring chipping or the like because the hard coating layer has an attenuation action with respect to an impact even in heavy intermittent cutting of an alloy steel or the like to which an intermittent and impacting heavy load is exerted to a cutting edge.

DETAILED DESCRIPTION OF THE INVENTION

Next, a coated tool of the present invention will be exemplarily described in detail.

Further, while a coated tool constituted by a tool body formed of a tungsten carbide (WC)-based cemented carbide and a coated tool constituted by a tool body formed of a cubic boron nitride (cBN) sintered material will be described as a specific example, a coated tool using a titanium carbonitride-based cermet as a tool body will also be described similarly.

Example 1

Production of Tool Body:

A Co powder, a TiC powder, a VC powder, a TaC powder, an NbC powder, a $Cr_3C_2$ powder, and a WC powder, all of which have an average grain size of 0.5 to 5 μm, were prepared as raw powders, these raw powders were blended into a blending composition shown in Table 1 and then mixed in a ball mill for 72 hours through wet mixing by adding wax, the mixed raw powders were decompressed and dried, and then the dried raw powders were pressed at a pressure of 100 MPa to sinter a green compact of these powders, and the sintered material was machined to have a predetermined dimension to form tool bodies 1 to 3 of the WC-based cemented carbide having an insert shape of ISO Standard SEEN 1203 AFTN1 were manufactured.

TABLE 1

| Tool body type | Blending composition (mass %) | | | | | | |
|---|---|---|---|---|---|---|---|
| | Co | TiC | VC | TaC | NbC | $Cr_3C_2$ | WC |
| 1 | 7.5 | — | 2.0 | — | 2.5 | — | balance |
| 2 | 12.0 | — | 1.0 | — | — | 0.5 | balance |
| 3 | 9.5 | 2.0 | — | 1.5 | 0.5 | — | balance |

Figure 1:
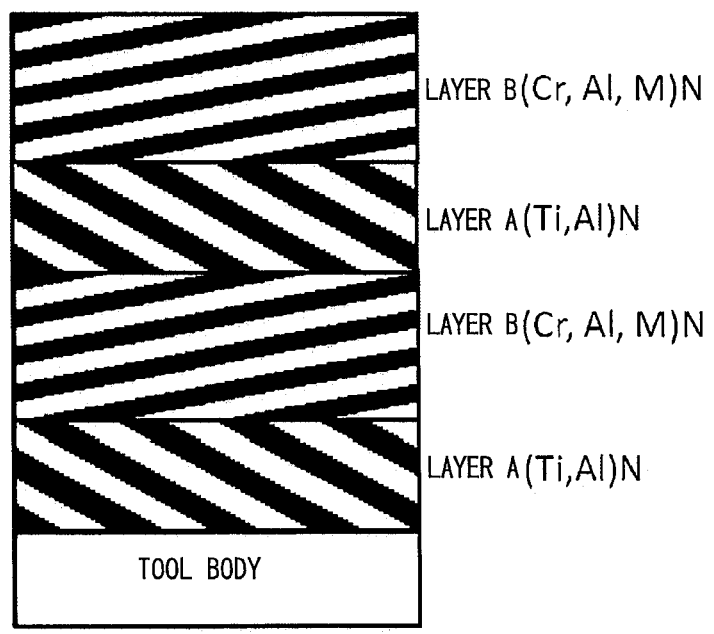
FIG. 1 shows an example of a longitudinal cross-sectional schematic diagram of a hard coating layer of a coated tool of the present invention.
Figure 2A:
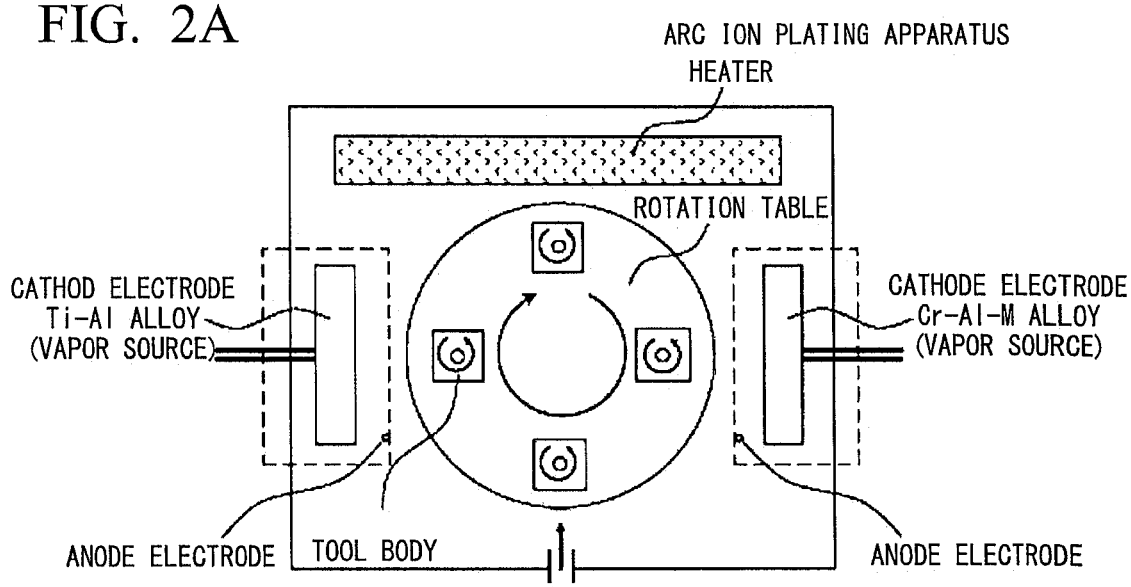
FIG. 2A shows a schematic plan view of an arc ion plating apparatus used in forming the hard coating layer.
Figure 2B:
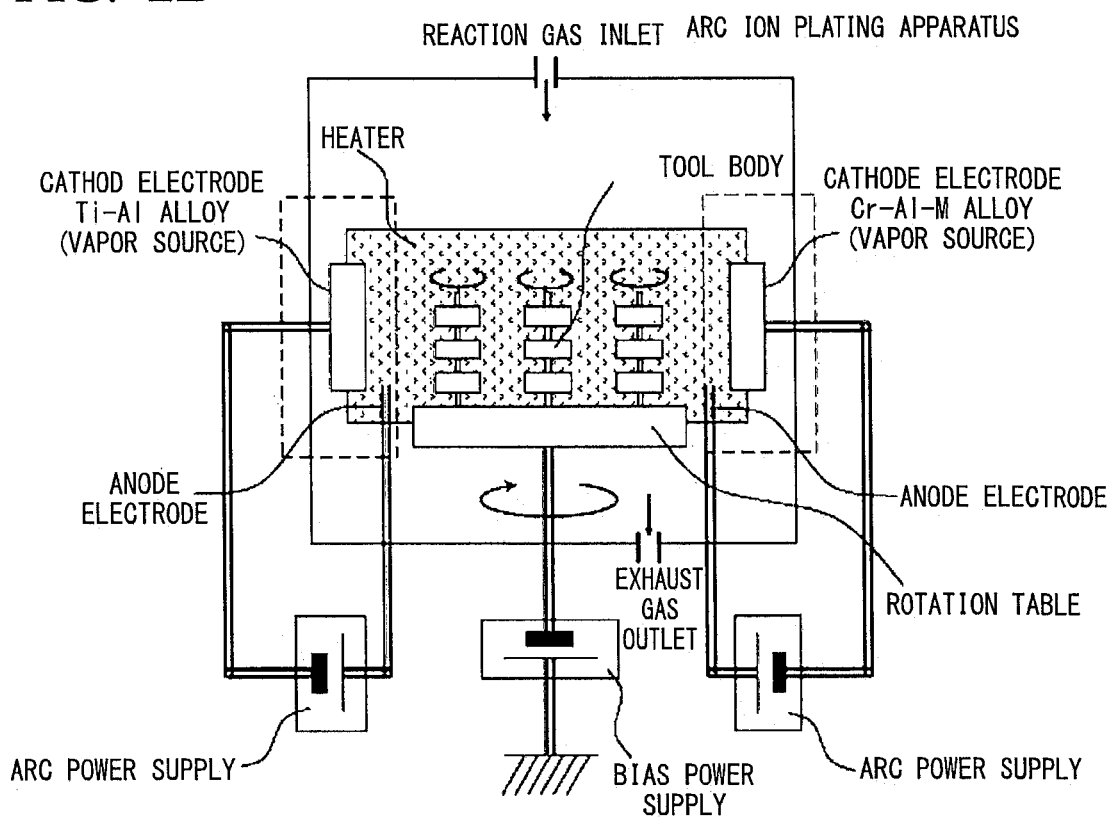
FIG. 2B shows a schematic front view of the arc ion plating apparatus used in forming the hard coating layer.

Film Forming Process:

Using an arc ion plating apparatus (4) shown in FIGS. 2A and 2B with respect to the tool bodies 1 to 3 formed of the WC-based cemented carbide, (a) the tool bodies 1 to 3 were mounted on an outer circumferential section at positions spaced a predetermined distance from a central axis in a radial direction on a rotating table (6) in the arc ion plating apparatus (4) in a state in which the tool bodies were ultrasonically cleaned in acetone and dried.

(b) First, after the inside of the apparatus was heated to 500° C. by a heater (5) while holding vacuum of $10^{-2}$ Pa or less by evacuating the inside of the apparatus, the inside was set to an Ar gas atmosphere of 0.5 to 2.0 Pa, a direct current bias voltage of −200 to −1000V was applied to the tool body (3) that was rotated while being autorotated on the rotating table (6), and bombarding processing was performed on a surface of the tool body (3) using argon ions for 5 to 30 minutes.

(c) Next, a hard coating layer formed in an alternating laminated structure was formed as follows.

First, the inside of the apparatus was maintained at a temperature in the apparatus shown in Table 2, rotation was similarly suppressed to the rotation number of the rotating table (6) shown in Table 2, and when an A layer was formed, nitrogen gas was introduced into the apparatus as a reactant gas to form a predetermined reaction atmosphere within a range of 2 to 10 Pa shown in Table 2, a predetermined direct current bias voltage within a range of −25 to −75V shown in Table 2 was applied to the tool body (3) that was rotated while being autorotated on the rotating table (6), and a predetermined current within a range of 90 to 140 A shown in Table 2 flowed through a cathode electrode (a vapor source) (7) for forming the A layer to generate an arc discharge. Next, when a B layer was formed, nitrogen gas was introduced into the apparatus as the reactant gas to form a predetermined reaction atmosphere within a range of 2 to 10 Pa shown in Table 2, a predetermined direct current bias voltage within a range of −25 to −75V shown in Table 2 was applied to the tool body (3) that was rotated while being autorotated on the rotating table (6), a predetermined current within a range of 90 to 140 A shown in Table 2 flowed similarly through a cathode electrode (a vapor source) (9) for forming the B layer to generate an arc discharge, and a hard coating layer formed in an alternating laminated structure having a target composition and further a target average layer thickness of one layer of the A layer (1) and the B layer (2) shown in Table 4 was deposited on surfaces of the tool bodies 1 to 3, and thus, coated tools of the present invention (referred to as "tools of the present invention") 1 to 6 shown in Table 4 were produced.

Further, in the deposition film-forming process of (a) to (c), in particular, a lattice constant of crystal grains of the entire hard coating layer constituted by the A layer (1) and the B layer (2) was controlled by adjusting a bias voltage in a deposition condition of the A layer (1) and the B layer (2), in addition, an orientation of the crystal grains of the entire hard coating layer constituted by the A layer (1) and the B layer (2) was controlled by adjusting an arc current value, a partial pressure of nitrogen gas as the reactant gas, the bias voltage, a depositing temperature, and the like such that a hard coating layer having a lattice constant a and an X-ray diffraction peak intensity ratio I(200)/I(100) shown in Table 4 was formed.

Figure 3:
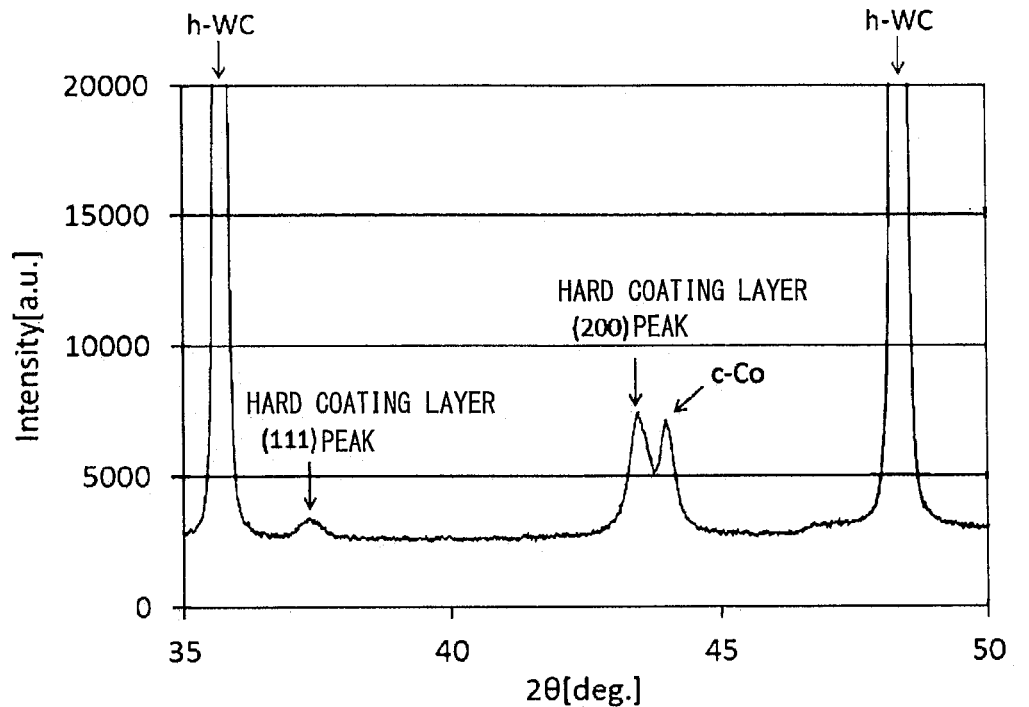
FIG. 3 shows an example of an X-ray diffraction chart measured with respect to the coated tool of the present invention.

While FIG. 3 shows an example of an X-ray diffraction result measured with respect to a hard coating layer of the tool 3 of the present invention, it should be appreciated that a value of a ratio I(200)/I(111) of a (200) plane diffraction peak intensity I(200) and a (111) plane diffraction peak intensity I(111) of the entire hard coating layer constituted by the A layer (1) and the B layer (2) was 5.53, and a lattice constant a calculated from a (200) plane diffraction peak angle of the B layer (2) was 4.17 Å.

For comparison, with respect to the tool bodies 1 to 3, like Example 1, under the condition shown in Table 3, the coated tools (referred to as "tools of Comparative Example") 1 to 6 of Comparative Example shown in Table 5 were produced by depositing a hard coating layer having an alternating laminated structure constituted by the A layer (1) and the B layer (2) thereon.

In the tools 1 to 6 of the present invention and the tools 1 to 6 of Comparative Example as produced above, a composition of the A layer (1) and the B layer (2) and further a layer thickness were measured at a plurality of places through cross-sectional measurement of a longitudinal cross section of the hard coating layer using a scanning electron microscopy (SEM), a transmission electron microscope (TEM), or an energy dispersive X-ray spectroscopy (EDS), and the composition and an average layer thickness of one layer were calculated by averaging them.

In addition, an orientation of the entire hard coating layer constituted by the A layer (1) and the B layer (2) was calculated from values of overlapping X-ray diffraction peak intensities I(200) and I(111) of the A layer (1) and the B layer (2) measured through X-ray diffraction using a Cr bulb. In addition, a lattice constant of the entire hard coating layer constituted by the A layer (1) and the B layer (2) was calculated from an angle of an X-ray diffraction peak of a (200) plane (see FIG. 3).

FIG. 3 shows X-ray diffraction results measured with respect to the hard coating layer of the tool 3 of the present invention.

Figure 4:
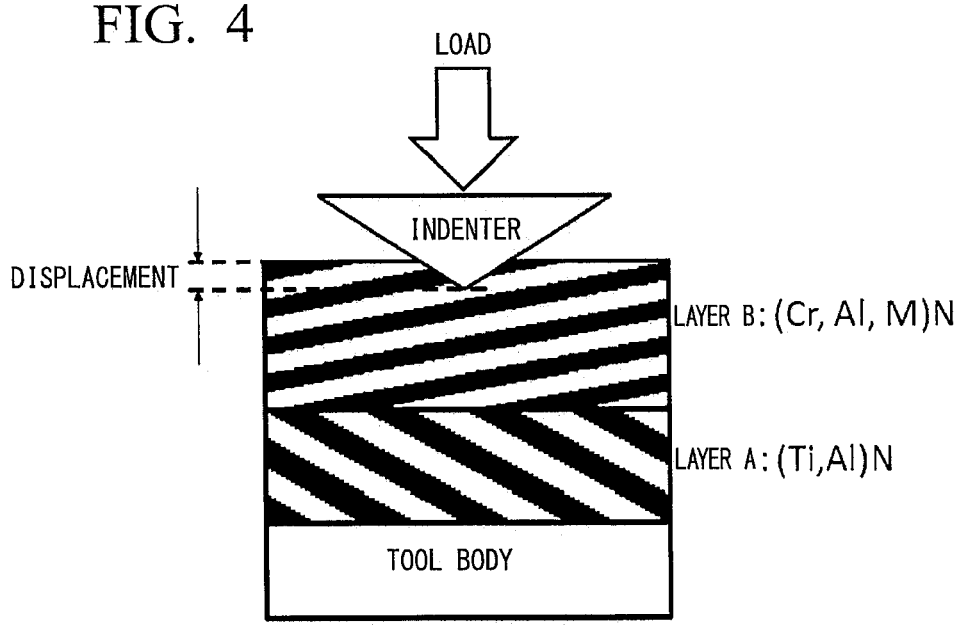
FIG. 4 shows a view for schematically explaining a test method to obtain a plastic deformation work ratio.

In addition, in the B layers (2) serving as the outermost surface layers of the hard coating layers of the tools 1 to 6 of the present invention and the tools 1 to 6 of Comparative Example as produced above, since a nanoindentation test is performed with an indentation depth of 1/10 or less of a layer thickness of B layer (2) (see FIG. 4), the surface of the B layer (2) was displaced, a load curve of a displacement-load and an unloading curve of the displacement-load were obtained (see FIG. 5), a plastic deformation work ratio $W_{plast}$ and an elastic deformation work $W_{elast}$ were obtained from a difference between the load curve and unloading curve, and a plastic deformation work ratio $W_{plast}/(W_{plast}+W_{elast})$ was calculated from these values.

Figure 5:
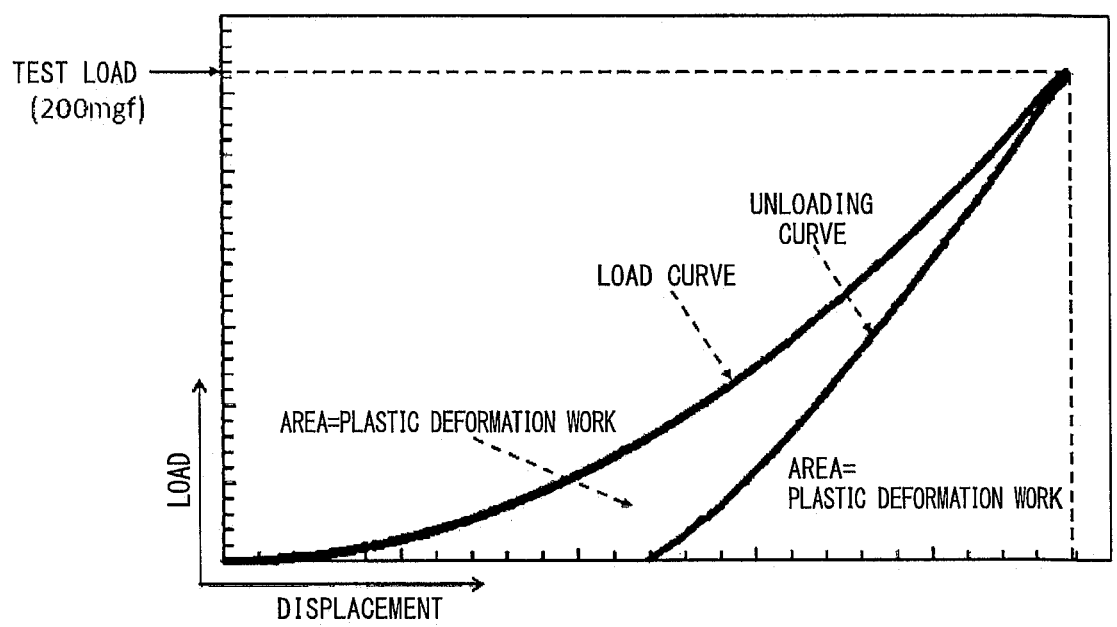
FIG. 5 is a view for schematically explaining a load curve of a displacement-load and an unloading curve of the displacement-load obtained by the test method of FIG. 4.

FIG. 5 shows a view schematic explaining a load curve of a displacement-load and an unloading curve of the displacement-load measured with respect to the B layer (2) of the hard coating layer of the tool 3 of the present invention. Further, a test load was determined according to a layer thickness of the tool such that an indentation depth becomes an indentation depth of 1/10 or less of the layer thickness of the B layer (2) even in a sample having the smallest layer thickness of the B layer (2) of the outermost surface in samples that are simultaneously measured. In the measurement results shown in FIG. 5, it was confirmed that the test was performed at a test load of 200 mgf and the indentation depth was 1/10 or less of the layer thickness of the B layer (2). Various values obtained as above are shown in Table 4 and Table 5.

TABLE 2

| | | | Cathode electrode (target) type | | | Deposition conditions | | | | | | |
|---|---|---|---|---|---|---|---|---|---|---|---|---|
| | | | | | | | | Deposition conditions upon A layer formation | | | Deposition conditions upon B layer formation | | |
| Type | | Tool body type | For forming A layer | For forming B layer | Temperature (°C.) | Rotating table rotation speed (rpm) | $N_2$ gas pressure (Pa) | Direct current bias voltage (V) | Arc current (A) | $N_2$ gas pressure (Pa) | Direct current bias voltage (V) | Arc current (A) |
| Tools of the present invention | 1 | 1 | Al0.60Ti0.40 | Cr0.67Al0.30Si0.03 | 400 | 1.5 | 6.0 | −40 | 140 | 4.0 | −40 | 120 |
| | 2 | 2 | Al0.50Ti0.50 | Cr0.90Al0.05V0.05 | 450 | 3.0 | 2.0 | −70 | 140 | 4.0 | −50 | 140 |
| | 3 | 3 | Al0.55Ti0.45 | Cr0.70Al0.30 | 450 | 2.0 | 6.0 | −25 | 100 | 6.0 | −40 | 100 |
| | 4 | 1 | Al0.65Ti0.35 | Cr0.80Al0.20 | 500 | 1.5 | 10.0 | −25 | 90 | 10.0 | −30 | 90 |
| | 5 | 2 | Al0.70Ti0.30 | Cr0.79Al0.20Si0.01 | 500 | 2.0 | 8.0 | −40 | 90 | 8.0 | −50 | 90 |
| | 6 | 3 | Al0.45Ti0.55 | Cr0.88Al0.10B0.02 | 400 | 3.0 | 6.0 | −25 | 100 | 6.0 | −26 | 100 |

TABLE 3

| | | | Cathode electrode (target) type | | | Deposition conditions | | | | | | |
|---|---|---|---|---|---|---|---|---|---|---|---|---|
| | | | | | | | | Deposition conditions upon A layer formation | | | Deposition conditions upon B layer formation | | |
| Type | | Tool body type | For forming A layer | For forming B layer | Temperature (°C.) | Rotating table rotation speed (rpm) | $N_2$ gas pressure (Pa) | Direct current bias voltage (V) | Arc current (A) | $N_2$ gas pressure (Pa) | Direct current bias voltage (V) | Arc current (A) |
| Tools of comparative example | 1 | 1 | Al0.5Ti0.5 | Cr0.69Al0.30Si0.01 | 400 | 3.0 | 1.0 | −50 | 180.0 | 2.0 | −25 | 160 |
| | 2 | 2 | Al0.65Ti0.35 | Cr0.55Al0.40Si0.05 | 350 | 3.0 | 0.5 | −100 | 160.0 | 1.0 | −75 | 160 |
| | 3 | 3 | Al0.6Ti0.4 | Cr0.80Al0.20 | 550 | 1.5 | 10.0 | −25 | 80.0 | 12.0 | −100 | 90 |
| | 4 | 1 | Al0.7Ti0.3 | Cr0.60Al0.40 | 450 | 2.0 | 2.0 | −10 | 80.0 | 6.0 | −25 | 160 |
| | 5 | 2 | Al0.55Ti0.45 | Cr0.89Al0.10V0.01 | 500 | 1.5 | 14.0 | −75 | 80.0 | 10.0 | −100 | 100 |
| | 6 | 3 | Al0.45Ti0.55 | Cr0.65Al0.30B0.05 | 350 | 2.0 | 1.0 | −75 | 160.0 | 1.0 | −10 | 140 |

TABLE 4

Hard coating layer of alternating lamination structure

| Type | | Tool body type | A layer Layer composition (value of z) | A layer Average layer thickness of one layer (μm) | Type of M component | B layer Layer composition (value of x) | B layer Layer composition (value of y) | B layer Average layer thickness of one layer (μm) | X-ray diffraction peak intensity ratio I(200)/I(111) | Lattice constant (Å) | Plastic deformation work ratio of B layer | Layer thickness ratio (tB/tA) | Total layer thickness (μm) |
|---|---|---|---|---|---|---|---|---|---|---|---|---|---|
| Tools of | 1 | 1 | 0.58 | 0.4 | Si | 0.28 | 0.03 | 0.5 | 3.66 | 4.15 | 0.37 | 1.3 | 2.7 |
| the | 2 | 2 | 0.48 | 0.4 | V | 0.04 | 0.05 | 0.5 | 2.39 | 4.18 | 0.48 | 1.3 | 1.8 |
| present | 3 | 3 | 0.52 | 0.5 | — | 0.29 | 0.00 | 0.6 | 5.53 | 4.17 | 0.38 | 1.2 | 1.1 |
| invention | 4 | 1 | 0.63 | 0.4 | — | 0.19 | 0.00 | 0.8 | 8.37 | 4.14 | 0.43 | 2.0 | 2.4 |
| | 5 | 2 | 0.67 | 0.8 | Si | 0.18 | 0.01 | 0.6 | 7.18 | 4.12 | 0.40 | 0.8 | 1.4 |
| | 6 | 3 | 0.40 | 0.4 | B | 0.09 | 0.02 | 0.4 | 4.24 | 4.19 | 0.45 | 1.0 | 0.8 |

TABLE 5

Hard coating layer of alternating lamination structure

| Type | | Tool body type | A layer Layer composition (value of z) | A layer Average layer thickness of one layer (μm) | Type of M component | B layer Layer composition (value of x) | B layer Layer composition (value of y) | B layer Average layer thickness of one layer (μm) | X-ray diffraction peak intensity ratio I(200)/I(111) | Lattice constant (Å) | Plastic deformation work ratio of B layer | Layer thickness ratio (tB/tA) | Total layer thickness (μm) |
|---|---|---|---|---|---|---|---|---|---|---|---|---|---|
| Tools of | 1 | 1 | 0.48 | 0.5 | Si | 0.28 | 0.01 | 0.3 | *0.96 | 4.17 | 0.36 | *0.6 | 0.8 |
| comparative | 2 | 2 | 0.62 | 0.8 | Si | 0.37 | 0.04 | 0.7 | *1.27 | 4.15 | 0.28 | 0.9 | 1.5 |
| example | 3 | 3 | 0.58 | 0.4 | — | 0.17 | 0.00 | 0.4 | *11.4 | 4.17 | 0.39 | 1.0 | 1.6 |
| | 4 | 1 | 0.68 | 0.5 | — | 0.39 | 0.00 | 0.5 | 2.78 | *4.09 | 0.35 | 1.0 | 1.0 |
| | 5 | 2 | 0.52 | 0.3 | V | 0.07 | 0.01 | 0.5 | *12.2 | *4.21 | 0.45 | 1.7 | 2.4 |
| | 6 | 3 | 0.42 | 0.4 | B | 0.27 | 0.05 | 1.0 | *1.69 | 4.18 | 0.32 | *2.5 | 2.8 |

*shows items outside of the scope of the claim of the instant US application.

Next, in the tools 1 to 6 of the present invention and the tools 1 to 6 of Comparative Example, a high speed face milling test of a single blade was performed under the following conditions.

Cutting Condition B:
Workpiece: block material of JIS/S45C (width 70 mm×length 300 mm),
Cutting speed: 160 m/min,
Rotational speed: 408 rev/min,
Depth of cut: 2.5 mm,
Feed: 0.20 mm/blade, and
Width of cut: 70 mm Cutting was performed to a cutting length 1600 m and a width of a flank wear was measured under the above-mentioned conditions. In addition, the existence of the occurrence of chipping was observed.

Test results are shown in Table 6.

TABLE 6

| Type | | Width of flank wear (mm) | Existence of chipping | Type | | Width of flank wear (mm) | Existence of chipping |
|---|---|---|---|---|---|---|---|
| Tools of | 1 | 0.13 | None | Tools of | 1 | *9 | Exist |
| the | 2 | 0.17 | None | Compar- | 2 | *6 | Exist |
| present | 3 | 0.09 | None | ative | 3 | *8 | Exist |
| inven- | 4 | 0.14 | None | example | 4 | 0.21 | None |
| tion | 5 | 0.10 | None | | 5 | *6 | Exist |
| | 6 | 0.12 | None | | 6 | *4 | Exist |

*shows a cutting time (min) until a life time due to occurrence of chipping.

Example 2

Production of Tool Body:

A raw powders for forming a bonded phase of a TiN powder, a TiCN powder, an Al powder, an AlN powder, and an $Al_2O_3$ powder, all of which have an average grain size of 2.0 μm or less were prepared as raw powders while preparing raw powders for forming a hard phase of cBN particles having an average grain size of 1.0 μm.

The raw powders were blended at a blending ratio shown in Table 1 such that a content ratio of cBN particles when a content of some of the raw powders from these raw powders and a cBN powder is 100 volume % becomes 40 to 80 volume %.

Next, after the raw powders were mixed by a ball mill for 72 hours through wet mixing and then dried, the raw powders were pressed at a dimension of a diameter: 50 mm×thickness: 1.5 mm at a molding pressure of 100 MPa, the green compact was held at a predetermined temperature within a range of 900 to 1300° C. under a vacuum atmosphere of a pressure: 1 Pa or less to be temporarily sintered, and then, a cBN sintered material was formed by loading the temporarily sintered material into an ultrahigh pressure sintering apparatus and sintering the temporally sintered material at a pressure: 5 GPa and a predetermined temperature within a range of 1200 to 1400° C.

The sintered material was cut to a predetermined dimension by a wire electric discharge machine, a brazing section (a corner section) of an insert main body formed of a WC-based cemented carbide having a composition of Co: 5mass %, TaC: 5mass %, WC: balance and an insert shape of ISO Standard CNGA 120408 was brazed using an Agbased brazing filler material having a composition of Cu: 26%, Ti: 5%, Ag: balance in mass %, and cBN tool bodies 11 to 13 having an insert shape of ISO Standard CNGA 120408 were manufactured by performing grind on upper and lower surfaces and an outer circumference and honing processing.

TABLE 7

| Tool body type | Blending composition (volume %) | | | | | |
|---|---|---|---|---|---|---|
| | TiN | TiCN | Al | AlN | Al$_2$O$_3$ | cBN |
| 11 | — | 26 | 31 | — | 3 | 40 |
| 12 | 26 | — | 13 | — | 1 | 60 |
| 13 | 12 | — | 7 | 1 | — | 80 |

Next, like the case of Example 1, as the hard coating layer is deposited on the cBN tool bodies 11 to 13 under the conditions shown in Table 8 using the arc ion plating apparatus (4) shown in FIGS. 2A and 2B, the coated tools of the present invention shown in Table 10 (referred to as "tools of the present invention") 11 to 16 on which the hard coating layer formed in the alternating laminated structure of the A layer (1) and the B layer (2) is deposited were produced.

For comparison, as the hard coating layer is deposited on the tool bodies 11 to 13 under the conditions shown in Table 9, the coated tools of Comparative Example shown in Table 11 (referred to "tools of Comparative Example) 11 to 16 were produced.

With respect to the tools 11 to 16 of the present invention and the tools 11 to 16 of Comparative Example produced as above, like Example 1, compositions of layers and an average layer thickness of one layer were calculated.

In addition, an orientation and a lattice constant of the entire hard coating layer constituted by the A layer (1) and the B layer (2) were calculated from values of the measured X-ray diffraction peak intensities I(200) and I(111).

Further, the same nanoindentation test as Example 1 was performed with respect to the B layer (2), and a plastic deformation work ratio $W_{plast}/(W_{plast}+W_{elast})$ was calculated from the load curve of the displacement-load and the unloading curve of the displacement-load.

Various values obtained as described above are shown in Tables 10 and 11.

TABLE 8

| | | | | | Deposition conditions | | | | | | |
|---|---|---|---|---|---|---|---|---|---|---|---|
| | | | Cathode electrode (target) type | | | | Deposition conditions upon A layer formation | | | Deposition conditions upon B layer formation | | |
| Type | Tool body type | | For forming A layer | For forming B layer | Temperature in apparatus (° C.) | Rotating table rotation speed (rpm) | N$_2$ gas pressure (Pa) | Direct current bias voltage (V) | Arc current (A) | N$_2$ gas pressure (Pa) | Direct current bias voltage (V) | Arc current (A) |
| Tools of the present invention | 11 | 11 | Al0.66Ti0.35 | Cr0.80Al0.20 | 500 | 1.5 | 10.0 | −25 | 90 | 10.0 | −30 | 90 |
| | 12 | 12 | Al0.55Ti0.45 | Cr0.70Al0.30 | 450 | 2.0 | 6.0 | −25 | 100 | 6.0 | −40 | 100 |
| | 13 | 13 | Al0.60Ti0.40 | Cr0.67Al0.30Si0.03 | 400 | 1.5 | 6.0 | −40 | 140 | 4.0 | −40 | 120 |
| | 14 | 11 | Al0.70Ti0.30 | Cr0.79Al0.20Si0.01 | 500 | 2.0 | 8.0 | −40 | 90 | 8.0 | −50 | 90 |
| | 15 | 12 | Al0.45Ti0.55 | Cr0.88Al0.10B0.02 | 400 | 3.0 | 6.0 | −25 | 100 | 6.0 | −25 | 100 |
| | 16 | 13 | Al0.50Ti0.50 | Cr0.90Al0.05V0.05 | 450 | 3.0 | 2.0 | −70 | 140 | 4.0 | −50 | 140 |

TABLE 9

| | | | | | Deposition conditions | | | | | | |
|---|---|---|---|---|---|---|---|---|---|---|---|
| | | | Cathode electrode (target) type | | | | Deposition conditions upon A layer formation | | | Deposition conditions upon B layer formation | | |
| Type | Tool body type | | For forming A layer | For forming B layer | Temperature in apparatus (° C.) | Rotating table rotation speed (rpm) | N$_2$ gas pressure (Pa) | Direct current bias voltage (V) | Arc current (A) | N$_2$ gas pressure (Pa) | Direct current bias voltage (V) | Arc current (A) |
| Tools of comparative example | 11 | 11 | Al0.45Ti0.55 | Cr0.65Al0.30B0.05 | 350 | 2.0 | 1.0 | −75 | 160.0 | 1.0 | −10 | 140 |
| | 12 | 12 | Al0.6Ti0.4 | Cr0.80Al0.20 | 550 | 1.5 | 10.0 | −25 | 80.0 | 12.0 | −100 | 90 |
| | 13 | 13 | Al0.5Ti0.5 | Cr0.69Al0.30Si0.01 | 440 | 3.0 | 1.0 | −50 | 180.0 | 2.0 | −25 | 160 |
| | 14 | 11 | Al0.55Ti0.45 | Cr0.89Al0.10V0.01 | 500 | 1.5 | 14.0 | −75 | 80.0 | 10.0 | −100 | 100 |
| | 15 | 12 | Al0.7Ti0.3 | Cr0.60Al0.40 | 450 | 2.0 | 2.0 | −10 | 80.0 | 6.0 | −25 | 160 |
| | 16 | 13 | Al0.65Ti0.35 | Cr0.55Al0.40Si0.05 | 350 | 3.0 | 0.5 | −100 | 160.0 | 1.0 | −75 | 160 |

TABLE 10

| | | | A layer | | | B layer | | | X-ray | | | | |
|---|---|---|---|---|---|---|---|---|---|---|---|---|---|
| Type | | Tool body type | Layer composition (value of z) | Average layer thickness of one layer (μm) | Type of M component | Layer composition (value of x) | Layer composition (value of y) | Average layer thickness of one layer (μm) | diffraction peak intensity ratio I(200)/I(111) | Lattice constant (Å) | Plastic deformation work ratio of B layer | Layer thickness ratio (tB/tA) | Total layer thickness (μm) |
| Tools of the present invention | 11 | 11 | 0.62 | 0.4 | — | 0.19 | 0.00 | 0.8 | 8.65 | 4.14 | 0.42 | 2.0 | 2.4 |
| | 12 | 12 | 0.53 | 0.5 | — | 0.28 | 0.00 | 0.6 | 5.36 | 4.17 | 0.39 | 1.2 | 1.1 |
| | 13 | 13 | 0.58 | 0.4 | Si | 0.29 | 0.03 | 0.5 | 3.81 | 4.15 | 0.36 | 1.3 | 2.7 |
| | 14 | 11 | 0.67 | 0.8 | Si | 0.18 | 0.01 | 0.6 | 7.23 | 4.13 | 0.41 | 0.8 | 1.4 |
| | 15 | 12 | 0.43 | 0.4 | B | 0.10 | 0.02 | 0.4 | 4.32 | 4.19 | 0.44 | 1.0 | 0.8 |
| | 16 | 13 | 0.47 | 0.4 | V | 0.04 | 0.04 | 0.5 | 2.17 | 4.18 | 0.46 | 1.3 | 1.8 |

TABLE 11

| | | | A layer | | | B layer | | | X-ray | | | | |
|---|---|---|---|---|---|---|---|---|---|---|---|---|---|
| Type | | Tool body type | Layer composition (value of z) | Average layer thickness of one layer (μm) | Type of M component | Layer composition (value of x) | Layer composition (value of y) | Average layer thickness of one layer (μm) | diffraction peak intensity ratio I(200)/I(111) | Lattice constant (Å) | Plastic deformation work ratio of B layer | Layer thickness ratio (tB/tA) | Total layer thickness (μm) |
| Tools of comparative example | 11 | 11 | 0.43 | 0.4 | B | 0.27 | 0.05 | 1.0 | *1.87 | 4.19 | 0.31 | *2.5 | 2.8 |
| | 12 | 12 | 0.59 | 0.4 | — | 0.18 | 0.00 | 0.4 | *11.2 | 4.16 | 0.41 | 1.0 | 1.6 |
| | 13 | 13 | 0.47 | 0.5 | Si | 0.28 | 0.01 | 0.3 | *1.43 | 4.17 | 0.37 | *0.6 | 0.8 |
| | 14 | 11 | 0.51 | 0.3 | V | 0.07 | 0.01 | 0.5 | *12.1 | *4.21 | 0.46 | 1.7 | 2.4 |
| | 15 | 12 | 0.69 | 0.5 | — | 0.39 | 0.00 | 0.5 | 2.62 | *4.09 | 0.36 | 1.0 | 1.0 |
| | 16 | 13 | 0.63 | 0.8 | Si | 0.36 | 0.03 | 0.7 | *1.36 | 4.15 | 0.29 | 0.9 | 1.5 |

*shows items outside of the scope of the claim of the instant US application.

Next, in the tools 11 to 16 of the present invention and the tools 11 to 16 of Comparative Example, like the case of Example 1, the cutting test was performed under the following conditions.

Workpiece: round bar with 8 longitudinal grooves formed equal intervals in the longitudinal direction of JIS/SCr420 (60HRC),
Cutting speed: 130 m/min,
Depth of cut: 0.2 mm,
Feed: 0.10 mm/rev.,
Cutting time: 30 minutes.

A dry heavy intermittent cutting test of chrome steel under the above-mentioned conditions was performed, a width of flank wear of a blade was measured, and the existence of the occurrence of chipping was observed.

Test results are shown in Table 12.

TABLE 12

| Type | | Width of flank wear (mm) | Existence of chipping | Type | | Width of flank wear (mm) | Existence of chipping |
|---|---|---|---|---|---|---|---|
| Tools of the present invention | 11 | 0.09 | None | Tools of Comparative Example | 11 | *12 | Exist |
| | 12 | 0.06 | None | | 12 | *26 | Exist |
| | 13 | 0.09 | None | | 13 | *24 | Exist |
| | 14 | 0.07 | None | | 14 | *19 | Exist |
| | 15 | 0.08 | None | | 15 | 0.14 | None |
| | 16 | 0.11 | None | | 16 | *17 | Exist |

*shows a cutting time (min) until a life time due to occurrence of chipping.

According to the results of Table 6, in the tools 1 to 6 of the present invention, while an average of a width of a flank wear was about 0.08 mm, the tools 1 to 6 of Comparative Example had short life times due to the progression of flank wear and the occurrence of chipping over a short time.

In addition, according to the results of Table 12, in the tools 11 to 16 of the present invention, while the average of the width of the flank wear was about 0.13 mm, the tools 11 to 16 of Comparative Example had short life times due to the progression of flank wear and the occurrence of chipping over a short time.

From the results, it can be seen that the tool of the present invention has excellent chipping resistance and wear resistance under heavy intermittent cutting conditions.

INDUSTRIAL APPLICABILITY

A surface-coated cutting tool of the present invention provides excellent chipping resistance and wear resistance and excellent cutting performance for a long time not only in cutting under heavy intermittent cutting condition of an alloy steel but also in cutting of various workpieces such that it is possible to satisfactorily cope with high performance of a cutting apparatus, save labor of cutting, save energy and lower costs.

REFERENCE SYMBOL LIST

1: A layer (Cr, Al, M)N
2: B layer (Ti, Al)N
3: Tool body
4: Arc ion plating apparatus
5: Heater
6: Rotating table 7: Cathode electrode Ti—Al alloy (vapor source)
8, 10: Anode electrode
9: Cathode electrode Cr—Al-M alloy (vapor source)
11: Reactant gas introduction path
12: Exhaust gas outlet
13, 14: Arc power supply
15: Bias power supply

The invention claimed is:
1. A surface-coated cutting tool comprising:
a tool body made of a tungsten carbide-based cemented carbide, a titanium carbonitride-based cermet or a cubic boron nitride sintered material; and
a hard coating layer provided on a surface of the tool body, the hard coating layer being made of an alternate laminate structure, in which at least one A layer and at least one B layer are laminated, and having a total thickness of 0.5-3.0 μm,
wherein (a) the A layer is a complex nitride layer of Ti and Al satisfying a compositional formula: $(Ti_{1-z}Al_z)N$, $0.4 \leq z \leq 0.7$, z being a content ratio of Al in an atomic ratio,
(b) the B layer is a complex nitride layer of Cr, Al, and M satisfying a compositional formula: $(Cr_{1-x-y}Al_xM_y)N$, $0.03 \leq x \leq 0.4$ and $0.01 < y \leq 0.05$, x being a content ratio of Al in an atomic ratio, y being a total content ratio of a component M in an atomic ratio, and component M being one or more elements selected from: B, Si, and V,
(c) when an average layer thickness of the A layer is tA and an average layer thickness of the B layer is tB, a value of a ratio tB/tA satisfies 0.67 to 2.0,
(d) a lattice constant a(Å) of crystal grains that constitute the hard coating layer made of the A layer and the B layer calculated from a diffraction peak angle of a (200) plane obtained by X-ray diffraction of the entire hard coating layer made of the A layer and the B layer satisfies $4.10 \leq a \leq 4.20$, and
(e) when an X-ray diffraction peak intensity of the (200) plane is I(200) and an X-ray diffraction peak intensity of a (111) plane is I(111), each of I(200) and I(111) being obtained by the X-ray diffraction of the entire hard coating layer made of the A layer and the B layer, $2.0 \leq I(200)/I(111) \leq 10$ is satisfied.

2. The surface-coated cutting tool according to claim 1, wherein a value of a plastic deformation work ratio $W_{plast}/(W_{plast}+W_{elast})$, which is obtained by performing a nanoindentation test at an indentation depth of 1/10 or less of a layer thickness of the B layer, is within a range of 0.35 to 0.50.

3. The surface-coated cutting tool according to claim 1, wherein the hard coating layer comprises plural A layers and plural B layers are alternately laminated.

4. The surface-coated cutting tool according to claim 3, wherein the average thickness of the plural A layers is in a range of 0.4 to 0.8 μm, and
the average thickness of the plural B layers is in a range of 0.4 to 0.8 μm.

* * * * *